(12) United States Patent
Mori et al.

(10) Patent No.: US 6,183,883 B1
(45) Date of Patent: Feb. 6, 2001

(54) BRAZING OR SOLDERING MATERIAL AND MANUFACTURING METHOD THEREFOR

(75) Inventors: Yoshiaki Mori, Nagano-ken; Katsuhiro Takahashi, Shiojiri; Takuya Miyakawa; Yasushi Karasawa, both of Suwa, all of (JP)

(73) Assignee: Seiko Epson Corporation, Tokyo (JP)

( * ) Notice: Under 35 U.S.C. 154(b), the term of this patent shall be extended for 0 days.

(21) Appl. No.: 09/098,777

(22) Filed: Jun. 16, 1998

(30) Foreign Application Priority Data

Jun. 19, 1997 (JP) .................................................. 9-162465

(51) Int. Cl.⁷ ........................... B32B 15/04; B23K 31/02; C23C 14/06
(52) U.S. Cl. .............................. 428/621; 148/23; 148/26; 148/283; 204/192.1; 228/206; 228/214; 228/223; 427/123; 427/190; 427/430.1; 428/615; 428/926
(58) Field of Search ..................................... 428/621, 622, 428/623, 926, 615, 696; 148/23, 26, 283; 228/214, 223, 206; 427/123, 190, 430.1; 204/192.1; 75/308, 10.46, 10.55

(56) References Cited

U.S. PATENT DOCUMENTS

| | | | |
|---|---|---|---|
| 4,699,806 | * 10/1987 | Fait et al. | 204/192.1 |
| 4,921,157 | 5/1990 | Dishon et al. | 228/124.1 |
| 5,052,612 | * 10/1991 | Tecle | 148/26 |
| 5,407,121 | * 4/1995 | Koopman et al. | 228/206 |

FOREIGN PATENT DOCUMENTS

| | | |
|---|---|---|
| 5-304235 | * 11/1993 | (JP) . |
| 7-164136 | * 6/1995 | (JP) . |
| 2527278 | 6/1996 | (JP) . |

* cited by examiner

*Primary Examiner*—Deborah Jones
*Assistant Examiner*—Robert R. Koehler

(57) ABSTRACT

Brazing or soldering materials which effectively improve the wettability of the brazing alloy or solder without using flux and a method of manufacturing such materials are provided. A metallic base is placed on turntable inside a vacuum chamber. A copper target is affixed to a sputtering electrode above the metallic base. Air is removed from the vacuum chamber through a vacuum outlet to increase the vacuum therein to a specific pressure, and carbon tetrafluoride and argon are introduced from a gas inlet to control the sputter pressure. Thereafter, turntable is rotated while a high frequency voltage is applied between the target and the metallic base to form a halide layer, such as a layer of copper fluoride, on a surface of metallic base.

22 Claims, 1 Drawing Sheet

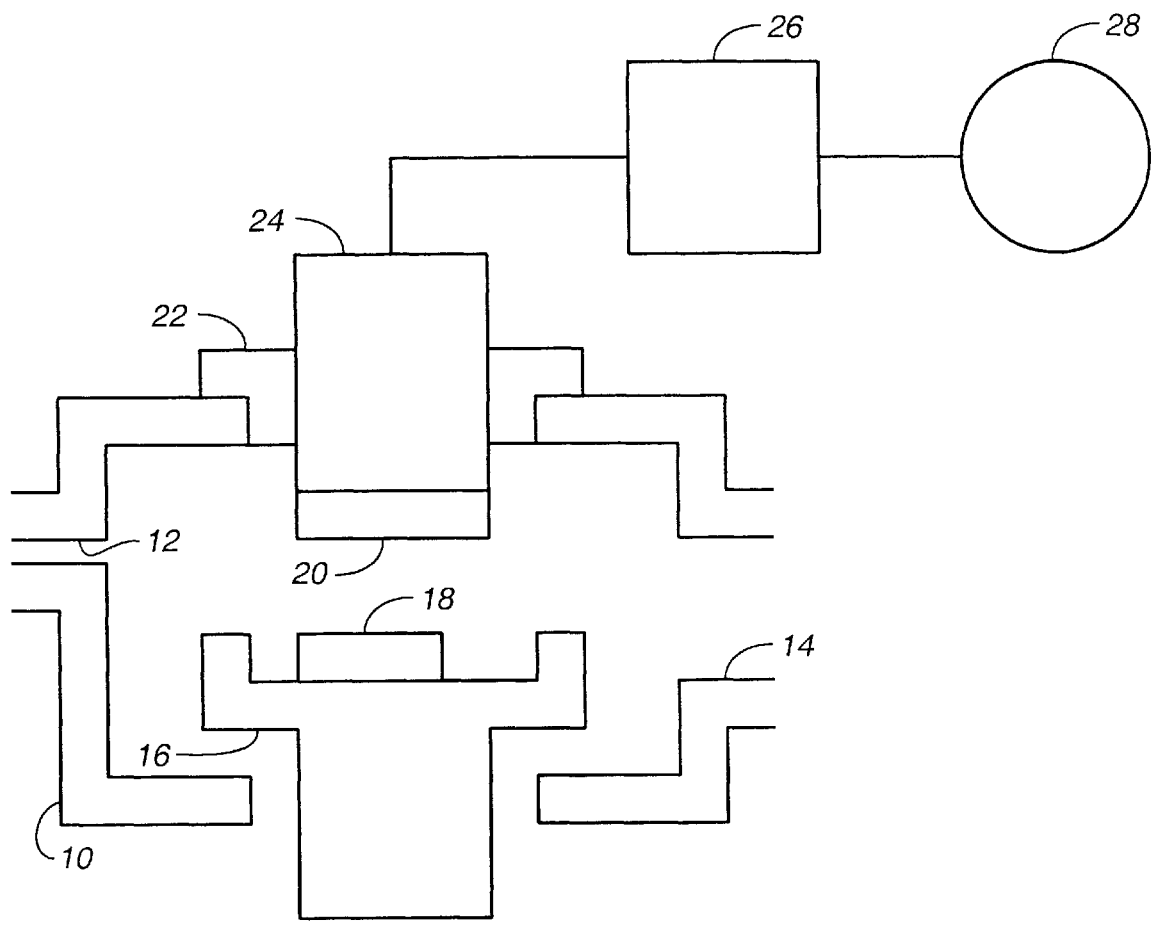
FIG._1

BRAZING OR SOLDERING MATERIAL AND MANUFACTURING METHOD THEREFOR

BACKGROUND OF THE INVENTION

1. Field of the Invention

The present invention relates to brazing and/or soldering materials for making connections by brazing or soldering, and a method for manufacturing such materials.

2. Description of the Related Art

Soldering is a method of connecting two base materials (or base metals) by thermally melting an alloy or metal with a melting point lower than that of the base materials so that the molten alloy or metal fills gaps between the base materials. The base materials themselves are not melted. Soldering is widely used in electronics because of its ability to connect complex, precision parts as well as metals of different types while having little effect on the base materials. Hard solder (also known as high melting solder) has a relatively high melting point and includes soldering materials such as silver, gold, as well as other types of hard solder. In contrast, soft solder (also known as low melting solder) has a relatively low melting point.

Soft solder, which is commonly referred to simply as solder, usually comprises tin and/or lead, and is widely used for lead frame connections in electronic products where a conductive connection is required. Conductivity is usually more important to solder than mechanical strength, and high wettability of the base materials is required. The presence of an oxidation coating on the joining surfaces of the base metals is known to greatly affect the wettability of solder and hard solder (brazing alloy below) used in brazing and soldering.

Flux has conventionally been used during normal soldering and brazing to remove any oxidation coating from the surfaces of the base metals. A problem common to soldering and brazing techniques that use flux for connecting leads in electronic products, even when a non-corrosive flux is used, is contamination of peripheral components and materials when the flux is applied. In addition, while there are cases in which flux containing a halogen is used for soldering, cleaning to remove any residual flux is generally required after soldering. Furthermore, while there are also cases in which residual flux is not cleaned after soldering, these methods either use a flux with a low halogen content, and thus sacrifice wettability, or use a flux with a high halogen content to assure solder wettability and thus risk the danger of migration resulting from the halogen component in the residual flux.

OBJECTS OF THE INVENTION

Therefore, it is an object of the present invention to overcome the aforementioned problems.

Another object of the present invention is to provide a soldering or brazing material for effectively improving the wettability of the soldered or brazed material without using flux, and to provide a manufacturing method for such material.

SUMMARY OF THE INVENTION

To achieve the above objects, a brazing or soldering material according to the present invention comprises a halide layer on a surface of a metallic base. By covering the surface of the metallic base, the halide layer prevents oxidation of the metallic base. During brazing or soldering, the halogen disperses into the metallic base or evaporates, thereby facilitating bonding between the metallic base and the metal used in the brazing alloy or solder, improving the wettability of the brazing alloy or solder without using flux, and thereby enabling easy fluxless brazing or soldering.

The halide layer is preferably a compound of a metal and a halogen. Particularly preferable are halides containing fluorine, such as silver fluoride (AgF), copper fluoride (CuF), and stannous fluoride ($SnF_2$), and halides containing chlorine, such as silver chloride (AgCl), copper chloride (CuCl), and stannous chloride ($SnCl_2$). The halide layer need only be formed to a thickness sufficient for the oxygen atoms in the oxidation layer on the surface of the metallic base to be replaced by the halogen, and to prevent oxidation of the metallic base surface. A thickness of 0.5 to 3 $\mu$m is thus sufficient. If the thickness of the halide layer is less than 0.5 $\mu$m, it may not be possible to prevent oxidation of the metallic base. In addition, if the halide layer thickness is greater than 3 $\mu$m, there may be an increase in ions contributing to corrosion, or a drop in wettability with pure metals.

A further brazing or soldering material according to the present invention comprises a halogen-impregnated metal. In a material thus comprised, the halogen present in the surface area of the metal prevents oxidation of the metal, and can therefore improve the wettability of the brazing or soldering material without using flux. The halogen in this case can be bromine (Br) or iodine (I), but fluorine (F) and chlorine (Cl) are preferable because of superior activity. The halogen concentration in the impregnated metal is 50 ppm to 5% by volume. When the halogen content exceeds 5%, there is a risk of an increase in ions contributing to corrosion, or a drop in wettability with pure metals as described above.

A manufacturing method for a brazing or soldering material according to the present invention comprises a step for forming a halide layer film on a surface of a metallic base by means of sputtering or vapor deposition. Film formation can also be accomplished by immersing the metallic base in a solution containing a halide, or coating a halide solution on a surface of the metallic base, and then drying naturally or by heating. Alternatively, the film can be formed by placing and then dissolving a halide on a surface of the metallic base, and then drying naturally or by heating.

A further manufacturing method for a brazing or soldering material according to the present invention comprises a step for adding and then melting a halide in a molten metal, and then solidifying the molten metal. The halide can comprise a halogen and a metal that is the same as the molten metal. For example, if the molten metal is copper, a copper halide is added, and if the molten metal is aluminum, an aluminum halide is added.

In each manufacturing method according to the present invention, the halide is preferably a halide of fluorine or chlorine.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings, wherein like reference symbols refer to like parts:

FIG. 1 shows an environment in which a brazing and soldering material may be manufactured according to a preferred embodiment of the present invention.

DESCRIPTION OF THE PREFERRED EMBODIMENTS

FIG. 1 is used to describe a manufacturing method for a brazing or soldering material according to a preferred embodiment of the present invention. As shown in FIG. 1, a vacuum chamber 10 comprises a gas inlet 12 for introducing a halogen gas to the vacuum chamber 10, and a vacuum outlet 14 connected to a vacuum pump or other depressurization means (not shown in the figure) for reducing the pressure inside vacuum chamber 10. A turntable 16 is placed inside vacuum chamber 10. A lead frame, terminal, or other metallic base 18 can be placed on this turntable 16. A target 20, which is copper, silver, tin, or other metal, is disposed above metallic base 18. The target 20 is fastened to a surface of the sputtering electrode 24 installed in vacuum chamber 10 with an insulating material 22 disposed between the target 20 and sputtering electrode 24. The sputtering electrode 24 is connected to a high frequency power source 28 through an impedance matching circuit 26.

It should be noted that film formation on metallic base 18 is possible by means of dc sputtering using a dc power supply because the target 20 is metal. The present embodiment uses an active halogen gas in a reactive sputtering process, however, and therefore uses high frequency sputtering with excellent reproducibility and discharge stability.

Production of a brazing or soldering material using a common sputtering apparatus is described next below.

The vacuum pump or depressurization means pumps air out from the vacuum chamber 10 through vacuum outlet 14 to increase the vacuum inside vacuum chamber 10 to a specific pressure. This pressure is normally 1/10 to 1/1000 of the sputter pressure. When the pressure inside vacuum chamber 10 reaches the specified degree of vacuum, a reaction gas containing a halide such as carbon tetrafluoride ($CF_4$), sulfur hexafluoride ($SF_6$), boron trichloride ($BCl_3$), or carbon tetrachloride ($CCl_4$), mixed with a carrier gas such as argon (Ar), is introduced to vacuum chamber 10 through gas inlet 12, and the pressure in vacuum chamber 10 is controlled to a specific sputter pressure (for example, 1 Pa). With turntable 16 then rotating, a high frequency voltage is applied between sputtering electrode 24 and turntable 16, specifically between target 20 and metallic base 18, to form a 0.5 to 3 $\mu$m thick film (layer) of a copper or other metal halide on the surface of metallic base 18 by means of sputtering. After film formation by means of sputtering for a specific period of time, vacuum chamber 10 is restored to atmospheric pressure, and metallic base 18 is removed. As a result of this process, a brazing or soldering material in which a metal halide layer is formed on the surface of a metallic base 18 can be obtained.

If it is necessary to provide a metal halide layer on the reverse side of metallic base 18, metallic base 18 can be simply turned over and the process repeated.

If the halide layer is to be provided only in selected areas of the metallic base 18, a mask can be used to cover the areas on which the halide layer is not required, thereby making it possible to form a halide layer only where required on the metallic base 18.

The gas flow rate during sputtering, and particularly the flow rate of the halogen gas with respect to the argon carrier, is an important factor affecting the quality of the resulting film, particularly the degree of halogenation. That is, increasing the flow rate of the halogen gas increases halogenation of the film.

The degree of halogenation is a parameter determining the wettability of the solder. As halogenation increases, solder wettability also improves up to a point but becomes saturated once halogenation reaches a particular level. In other words, within a certain range, there is a proportional relationship between solder wettability and the amount of halogen in the surface of the formed film or the metallic base 18. The maximum allowable amount of halogen contained in the surface is also determined by the type of metal constituting metallic base 18. Wettability can also be considered saturated when the surface of the metal constituting the metallic base 18 has reached the maximum allowable halogen content of that metal. As a result, it is not necessary to supply more halogen (that is, gas containing halogen) than is required to reach this saturation mode.

On the other hand, the presence of halogen can cause problems such as a drop in electrical conductivity and problems with corrosion, and because most halides are soluble, it is necessary to monitor the amount added. For example, when fluorine is used as the halogen, the optimum fluorine content in metallic base 18 is 50 ppm to 5% by volume. The surface condition of the metallic base 18 before sputter film formation, specifically the presence of contamination or oxidation, affects film adhesion. It is therefore preferable to use reverse sputtering before sputter film formation to remove such contamination and oxidation from the surface.

By thus covering the surface of metallic base 18 with a halide layer, oxidation of the metallic base 18 of the brazing or soldering material is prevented. During the heating process of the soldering operation, the halogen contained in the halide layer disperses into metallic base 18 or evaporates, and the metallic base 18 and the metal bonded with the halogen in the metal halide form a bond with the metal constituting the solder. As a result, good solder wettability can be achieved without using flux, the solder connection can be improved, and soldering that does not require a particular type of solder used is possible.

This means that by imparting a halide to a lead frame, conductor (copper wire), or the copper pattern on a circuit board, for example, it is possible to both prevent subsequent oxidation and make soldering simple. In addition, the same benefits can be achieved in brazing using a brazing alloy.

When forming the halide layer by sputtering, it is also possible to control the film thickness by changing the metal to halogen ratio, and thereby easily obtain conditions achieving good wettability.

Furthermore, a halide layer of which the metal component is different from the metal in the metallic base 18 can be easily sputtered onto the surface of the metallic base by using a target metal that is different from the metal in the metallic base 18. For example, if the metallic base is copper or aluminum, a silver or tin target can be used to easily form a layer of silver or tin fluoride or chloride on the surface of the metallic base.

It should be noted that the present invention has been described above using sputtering to form a halide layer on a surface of metallic base 18. From the description herein, it will also be obvious to those skilled in the art that a halide layer can be formed by means of vapor deposition in a halogen gas atmosphere, or by ionizing a halogen and implanting halogen ions in metallic base 18.

It is also possible to form a halide layer by immersing the metallic base in a solution containing a halide, or by coating the surface of the metallic base with a halide solution using a brush or other means, and then drying the coating naturally or by heating. In this case, the immersion or coating and drying process should be repeated a plurality of times to achieve a halide layer of sufficient thickness, that is, 0.5 to 3 $\mu$m as described above.

It is also possible to form the halide layer by placing a halide powder on the surface of metallic base 18, dissolving the halide with water or other suitable solvent, and then drying either naturally or by heating.

Yet another possibility is to add and melt a halide in a molten metal such as copper or aluminum, and then solidify the molten metal to achieve a halogen-impregnated metal that can be used as a brazing or soldering material. In this case the halide added to the molten metal is preferably a metal halide of which the metal component is the same as the molten metal. For example, if the molten metal is copper, copper fluoride or copper chloride is preferably added. If an alloy such as brass is used, a halide of an alloy of the same composition is added. It will also be obvious from the description herein that a halide of a metal different from the molten metal can be used as required. The halogen content is preferably 5 ppm to 5% by volume.

Specific examples tested to confirm the effectiveness of the methods described above are described next below.

EXAMPLE 1

A 0.5 mm thick copper chip measuring 5 mm (wide) by 25 mm (long) was placed as metallic base 18 on turntable 16 in the sputtering apparatus shown in FIG. 1. A 99.9% pure copper target 20 was fastened to sputtering electrode 24, and air was removed from vacuum chamber 10 via vacuum outlet 14 to achieve an internal pressure of 0.1 Pa. Argon (Ar) at 300 sccm and carbon tetrafluoride ($CF_4$) at 30 sccm were then supplied from gas inlet 12 to achieve a sputter pressure of 1 Pa. With turntable 16 then rotating, a high frequency voltage was applied between target 20 and metallic base (copper chip) 18 for film formation. A 100-W high frequency power supply was used. The high frequency power supply was turned off after 3 minutes, vacuum chamber 10 was then returned to atmospheric pressure, and metallic base (copper chip) 18 was removed.

To evaluate the solder wettability of the resulting copper chip 18 (sample A), it was compared with a copper chip with no halide film (sample 1), a copper chip which had been cleaned by reverse sputtering to remove any surface oxidation (sample 2), and a copper chip to which a commonly used flux was applied and then dried (sample 3).

For evaluation, a solder ball was placed on the top of each test sample (that is, sample A and samples 1 to 3). Each test sample and associated solder ball was heated in air at atmospheric pressure to reflow the solder, and then the size of the solder spread was measured. The solder balls used were Spark Ball S (product name) solder balls manufactured by Sumitomo Metal Industries, Ltd. and commonly used for BGA mounting. The outside diameter of each solder ball was 0.74 mm. The solder was a tin-lead alloy containing 62.0% to 64.0% tin. Test results are shown in Table 1 below.

TABLE 1

| Sample | Size of Solder Spread |
| --- | --- |
| Sample A | approx. 4.0 mm |
| Sample 1 | approx. 1.0 mm |
| Sample 2 | approx. 1.5 mm |
| Sample 3 | approx. 3.0 mm |

As shown by the above results:
(1) the solder wettability of the copper chip from which surface oxidation has been removed (sample 2) is better than that of a copper chip to which no surface processing has been applied (sample 1); and
(2) the solder wettability of the copper chip treated with flux (sample 3) is better than that of samples 1 and 2, but the solder wettability of the copper chip having a copper fluoride film formed on the surface thereof (sample A) is even better than that of sample 3.

It can therefore be concluded that an oxidation layer on the surface degrades solder wettability, and a certain amount of improvement can be achieved by simply removing the oxidation layer. However, simply removing the oxidation layer only achieves limited improvement in wettability because the heat used for soldering and brazing oxidizes the surface using oxygen in the air. As a result, greater improvement can be expected by reflowing the solder in a nitrogen atmosphere. On the other hand, oxidation from the heat of soldering can be prevented with sample A and sample 3 because the surface of the copper chip is coated with a fluoride film. As a result, a significant improvement in solder wettability can be achieved. An additional benefit of imparting a fluoride film coating to the surface of the copper chip is that long-term storage is also possible as is. That is, sample A comprising a surface layer of copper fluoride can be connected with solder without using flux, and can be stored without oxidation of the brazing or soldering material.

EXAMPLE 2

A 50% solution of 97% tin difluoride (stannous fluoride) dissolved in pure water was prepared and brushed onto a surface of a metal chip (5 mm×25 mm×0.5 mm), and dried naturally without wiping. This process was repeated a plurality of times to form a surface film of stannum fluoride ($SnO_yF_x$).

This stannum fluoride layer can also be achieved by placing 97% tin difluoride in powder form on the surface of the metal chip, dripping water drops to dissolve the powder, and then drying naturally.

It is also possible to immerse a metal chip in a solution of tin difluoride, remove the chip from the solution, and allow the coating to dry naturally without wiping to achieve a stannum fluoride ($SnO_yF_x$) surface film on the metal chip. These immersion and drying steps are also preferably repeated a plurality of times.

Samples with a stannum fluoride layer were manufactured using untreated copper, copper with tin surface plating, copper with palladium surface plating, copper with silver surface plating, copper with solder alloy surface plating. The solder wettability of these prepared samples was compared with the solder wettability of the same samples without a stannum fluoride layer. Comparison was made by placing and melting a solder ball on the surface of each sample as described in example 1 above, and then measuring the solder spread. The same solder used in example 1 above was also used. The results are shown in Table 2.

TABLE 2

| | Size of Solder Spread | |
| --- | --- | --- |
| Sample | Untreated | With $SnO_yF_x$ layer |
| Copper | approx. 1.0 mm | 2.0 mm |
| Tin plating | 1.5 mm | 4.0 mm |
| Palladium plating | 1.0 mm | 4.0 mm |
| Silver plating | 1.5 mm | 4.0 mm |
| Solder alloy plating | 2.1 mm | 5.0 mm |

As shown by the results in Table 2, when a stannum fluoride ($SnO_yF_x$) layer is formed by coating with a tin difluoride solution, there is a particular improvement in solder wettability with the silver-plated, tin-plated, and solder alloy-plated samples. While there is some improvement in solder wettability in the palladium-plated and untreated copper samples, solder wettability is less than what can be achieved after tin plating or plating with solder alloy. This is believed to be the result of initial surface oxidation, or surface oxidation from the heat of the solder process.

As described above, when a halide layer is imparted to a surface of a metallic base, or the metal is impregnated with halogen, the halide prevents surface oxidation of the metallic base, improves wettability of the brazing alloy or solder, and makes brazing or soldering without using flux simple.

While the invention has been described in conjunction with specific embodiments, it will be evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A soldering and brazing material, comprising:
   a metal base; and
   a halide layer formed on a surface of said metal base, the halide layer having a thickness of 0.5 $\mu$m to 3 $\mu$m.

2. A material according to claim 1, wherein said halide layer is a compound comprising a metal and a halogen.

3. A material according to claim 1, wherein said halide layer is a compound comprising a metal and a halogen selected from the group consisting of fluorine and chlorine.

4. A material according to claim 2, wherein said halogen is selected from the group consisting of fluorine and chlorine.

5. A material used in one of soldering and brazing, comprising:
   a metal impregnated with a halogen, wherein the concentration of the halogen in the impregnated metal is 50 ppm to 5% by volume.

6. A material according to claim 5, wherein the halogen is selected from the group consisting of fluorine and chlorine.

7. A method of manufacturing a soldering and brazing material, comprising a step of:
   forming a halide film on a surface of a metal base by one of sputtering and vapor deposition, wherein the halide layer has a thickness of 0.5 $\mu$m to 3 $\mu$m.

8. A method of manufacturing a material used in one of soldering and brazing, comprising the steps of:
   forming a halide film on a surface of a metal base; and
   drying the metal base.

9. The method according to claim 8, wherein the halide film is formed on a surface of the metal base by immersing the metal base in a solution containing a halide.

10. The method according to claim 8, wherein the halide film is formed on a surface of the metal base by coating a surface of a metal base with a solution containing a halide.

11. A method of manufacturing a material used in one of soldering and brazing, comprising a step of:
    forming a halide film on a surface of a metal base, comprising the steps of:
      placing and dissolving a halide on a surface of a metal base; and
      drying the metal base.

12. A method of manufacturing a material used in one of soldering and brazing, comprising a step of:
    forming a halide film on a surface of a metal base by adding and melting a halide in molten metal; and
    solidifying the molten metal.

13. The method according to claim 12, wherein the halide film is a compound comprising a halogen and the same metal as the molten metal.

14. The method according to claim 7, wherein the halide film is a compound comprising one of fluorine and chlorine.

15. The method according to claim 8, wherein the halide film is a compound comprising one of fluorine and chlorine.

16. The method according to claim 9, wherein the halide film is a compound comprising one of fluorine and chlorine.

17. The method according to claim 10, wherein the halide film is a compound comprising one of fluorine and chlorine.

18. The method according to claim 11, wherein the halide film is a compound comprising one of fluorine and chlorine.

19. The method according to claim 12, wherein the halide film is a compound comprising one of fluorine and chlorine.

20. The method according to claim 13, wherein the halide film is a compound comprising one of fluorine and chlorine.

21. A joined assembly, comprising:
    a first metal having a halide layer formed on a surface thereof the halide layer having a thickness of 0.5 $\mu$m to 3 $\mu$m;
    a second metal; and
    a joining substance for joining said first and second metals together by one of soldering and brazing.

22. A method of joining a first metal to a second metal to form a joined assembly, comprising the steps of:
    forming a halide film on a surface of a first metal the halide layer having a thickness of 0.5 $\mu$m to 3 $\mu$m; and
    joining said first metal having a halide layer formed thereon to a second metal by one of soldering and brazing.

* * * * *